(12) United States Patent
Radkov et al.

(10) Patent No.: US 7,358,542 B2
(45) Date of Patent: Apr. 15, 2008

(54) RED EMITTING PHOSPHOR MATERIALS FOR USE IN LED AND LCD APPLICATIONS

(75) Inventors: Emil Vergilov Radkov, Euclid, OH (US); Anant Achyut Setlur, Niskayuna, NY (US); Alok Mani Srivastava, Niskayuna, NY (US); Holly Ann Comanzo, Niskayuna, NY (US); Ljudmil Slavchev Grigorov, Sofia (BG); Thomas Francis McNulty, Ballston Lake, NY (US); Daniel Darcy Doxsee, Sagamore Hills, OH (US); William Winder Beers, Chesterland, OH (US)

(73) Assignee: Lumination LLC, Valley View, OH (US)

( * ) Notice: Subject to any disclaimer, the term of this patent is extended or adjusted under 35 U.S.C. 154(b) by 9 days.

(21) Appl. No.: 11/049,598

(22) Filed: Feb. 2, 2005

(65) Prior Publication Data
US 2006/0169986 A1    Aug. 3, 2006

(51) Int. Cl.
*H01L 33/00* (2006.01)
(52) U.S. Cl. .................. 257/98; 257/E33.061
(58) Field of Classification Search ................. 257/98, 257/E33.061
See application file for complete search history.

(56) References Cited

U.S. PATENT DOCUMENTS

| | | | |
|---|---|---|---|
| 3,450,642 A | 6/1969 | Hoffman | |
| 3,569,764 A | 3/1971 | Hanada et al. | |
| 3,617,357 A | 11/1971 | Nagy | |
| 4,075,532 A | 2/1978 | Piper et al. | |
| 4,079,287 A | 3/1978 | Soules et al. | |
| 4,267,485 A | 5/1981 | Murakami et al. | |
| 4,705,986 A | 11/1987 | Iwama et al. | |
| 4,806,824 A | 2/1989 | Paynter et al. | |
| 4,874,984 A | 10/1989 | Sigai et al. | |
| 4,891,550 A | 1/1990 | Northrop et al. | |
| 4,924,141 A | 5/1990 | Taubner et al. | |
| 5,041,758 A | 8/1991 | Huiskes et al. | |
| 5,049,779 A | 9/1991 | Itsuki et al. | |
| 5,207,948 A | 5/1993 | Wolfe et al. | |
| 5,350,971 A | 9/1994 | Jeong | |

(Continued)

FOREIGN PATENT DOCUMENTS

EP    0 993 022 A1    4/2000

(Continued)

OTHER PUBLICATIONS

PAJ machine translation of JP 2002-359404.*

(Continued)

*Primary Examiner*—Howard Weiss
(74) *Attorney, Agent, or Firm*—Fay Sharpe LLP

(57) ABSTRACT

Phosphor compositions including those having the formulas $A_{2-x}Eu_xW_{1-y}Mo_yO_6$, where A is selected from Y, Gd, Lu, La, and combinations thereof; and where $0.5 \leq x \leq 1.0$, $0.01 \leq y \leq 1.0$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors. Also disclosed are light emitting devices including a light source and at least one of the above phosphor compositions.

15 Claims, 6 Drawing Sheets

U.S. PATENT DOCUMENTS

| | | | |
|---|---|---|---|
| 5,612,590 A | 3/1997 | Trushell et al. | |
| 5,714,836 A | 2/1998 | Hunt et al. | |
| 5,731,658 A | 3/1998 | Lengyel et al. | |
| 5,731,659 A | 3/1998 | Soules et al. | |
| 5,770,917 A | 6/1998 | Yano et al. | |
| 5,838,101 A | 11/1998 | Pappalardo | |
| 5,851,063 A | 12/1998 | Doughty et al. | |
| 5,859,496 A | 1/1999 | Murazaki et al. | |
| 5,869,927 A | 2/1999 | Matsuo et al. | |
| 5,959,316 A | 9/1999 | Lowery | |
| 5,962,971 A | 10/1999 | Chen | |
| 5,998,925 A | 12/1999 | Shimizu et al. | |
| 6,010,644 A | 1/2000 | Fu et al. | |
| 6,013,199 A | 1/2000 | McFarland et al. | |
| 6,066,861 A | 5/2000 | Höhn et al. | |
| 6,069,440 A | 5/2000 | Shimizu et al. | |
| 6,084,250 A | 7/2000 | Jüstel et al. | |
| 6,096,243 A | 8/2000 | Oshio et al. | |
| 6,116,754 A | 9/2000 | Ocsovai et al. | |
| 6,117,362 A | 9/2000 | Yen et al. | |
| 6,137,217 A | 10/2000 | Pappalardo et al. | |
| 6,153,971 A | 11/2000 | Shimizu et al. | |
| 6,165,385 A | 12/2000 | Rao et al. | |
| 6,203,726 B1 | 3/2001 | Danielson et al. | |
| 6,210,605 B1 | 4/2001 | Srivastava et al. | |
| 6,222,312 B1 | 4/2001 | Ghosh et al. | |
| 6,246,744 B1 | 6/2001 | Duclos et al. | |
| 6,249,328 B1 | 6/2001 | Fukuzawa et al. | |
| 6,252,254 B1 | 6/2001 | Soules et al. | |
| 6,255,670 B1 | 7/2001 | Srivastava et al. | |
| 6,278,135 B1 | 8/2001 | Srivastava et al. | |
| 6,294,800 B1 | 9/2001 | Duggal et al. | |
| 6,302,959 B2 | 10/2001 | Srivastava et al. | |
| 6,319,425 B1 | 11/2001 | Tasaki et al. | |
| 6,351,069 B1 | 2/2002 | Lowery et al. | |
| 6,366,033 B1 | 4/2002 | Greci et al. | |
| 6,369,502 B1 | 4/2002 | Auber et al. | |
| 6,380,669 B1 | 4/2002 | Zachau et al. | |
| 6,400,097 B1 | 6/2002 | Jin et al. | |
| 6,402,987 B1 | 6/2002 | Srivastava et al. | |
| 6,409,938 B1 | 6/2002 | Cumanzo | |
| 6,429,583 B1 | 8/2002 | Levinson et al. | |
| 6,466,135 B1 | 10/2002 | Srivastava et al. | |
| 6,472,812 B2 | 10/2002 | Vose et al. | |
| 6,504,179 B1 | 1/2003 | Ellens et al. | |
| 6,513,949 B1 | 2/2003 | Marshall et al. | |
| 6,515,314 B1 | 2/2003 | Duggal et al. | |
| 6,517,741 B1 | 2/2003 | Feldmann et al. | |
| 6,521,915 B2 | 2/2003 | Odaki et al. | |
| 6,522,065 B1 | 2/2003 | Srivastava et al. | |
| 6,538,371 B1 | 3/2003 | Duggal et al. | |
| 6,552,487 B1 | 4/2003 | Ellens et al. | |
| 6,555,958 B1 | 4/2003 | Srivastava et al. | |
| 6,576,931 B2 | 6/2003 | Furukawa et al. | |
| 6,580,097 B1 | 6/2003 | Soules et al. | |
| 6,592,780 B2 | 7/2003 | Höhn et al. | |
| 6,596,195 B2 | 7/2003 | Srivastava et al. | |
| 6,621,211 B1 | 9/2003 | Srivastava et al. | |
| 6,660,186 B2 | 12/2003 | Ravilisetty | |
| 6,669,866 B1 | 12/2003 | Kummer et al. | |
| 7,094,362 B2 * | 8/2006 | Setlur et al. | 252/301.4 F |
| 2002/0105266 A1 | 8/2002 | Mayr et al. | |
| 2002/0158565 A1 | 10/2002 | Setlur et al. | |
| 2002/0195587 A1 | 12/2002 | Srivastava et al. | |
| 2003/0006694 A1 | 1/2003 | Carter | |
| 2003/0030060 A1 | 2/2003 | Okazaki | |
| 2003/0094893 A1 | 5/2003 | Ellens et al. | |
| 2005/0117361 A1 | 6/2005 | Takeda et al. | |
| 2005/0156496 A1 | 7/2005 | Takashima et al. | |
| 2005/0230689 A1 * | 10/2005 | Setlur et al. | 257/79 |
| 2005/0239227 A1 | 10/2005 | Aanegola et al. | |
| 2005/0253114 A1 | 11/2005 | Setlur et al. | |

FOREIGN PATENT DOCUMENTS

| | | |
|---|---|---|
| EP | 1 116 418 B1 | 7/2000 |
| EP | 1 095 998 A2 | 10/2000 |
| EP | 1 138 747 A2 | 10/2001 |
| EP | 1 139 440 A2 | 10/2001 |
| EP | 1 184 893 A2 | 3/2002 |
| EP | 1 193 306 A | 4/2002 |
| EP | 1 403 355 A | 3/2004 |
| JP | 2005 093912 A | 4/2005 |
| JP | 2002-359404 * | 12/2006 |
| WO | WO 00/33389 | 6/2000 |
| WO | WO 01/93342 A1 | 6/2001 |
| WO | WO 01/89000 A1 | 11/2001 |
| WO | WO 01/89001 A2 | 11/2001 |
| WO | WO 02/099902 A1 | 12/2002 |
| WO | WO 03/102113 A1 | 12/2003 |
| WO | WO 2004/056940 A1 | 7/2004 |
| WO | WO 2005/083037 A | 9/2005 |

OTHER PUBLICATIONS

G. Blasse and A. Bril, "On the $Eu^{3+}$ Fluorescence in Mixed Metal Oxides. III. Energy Transfer in $Eu^{3+}$ —Activated Tungstates and Molybdates of the Type $Ln_2 WO_6$ and $Ln_2MoO_6$", *The Journal of Chemical Physics*, vol. 45, No. 7, Oct. 1966, pp. 2350-2355.

J.S. Kim et al.: "gaN-based white-light-emitting diodes fabricated with a mixture of Ba3Mgsi208:eu and Sr2Si04: Eu phophors", *Japanese Journal of Applied Physics*, vol. 43, No. 3, 2004, pp. 989-992.

Narukawa, Yukio, "Present Status of UV-LDs and White LEDs", Patented Abstracts of the International, Synoposium on The Light for the 2nd Century, Mar. 2002, Tokyo, K-4, pp. 14-15.

Inorganic Phosphors: Compositions, Preparation and Optical Properties, CRC Press, 2004.

A.G. Paulusz, "Efficient MN(IV) Emission in Fluorine Coordination", J. Electrochem. Soc. 120, N7 (1973), p. 942.

* cited by examiner

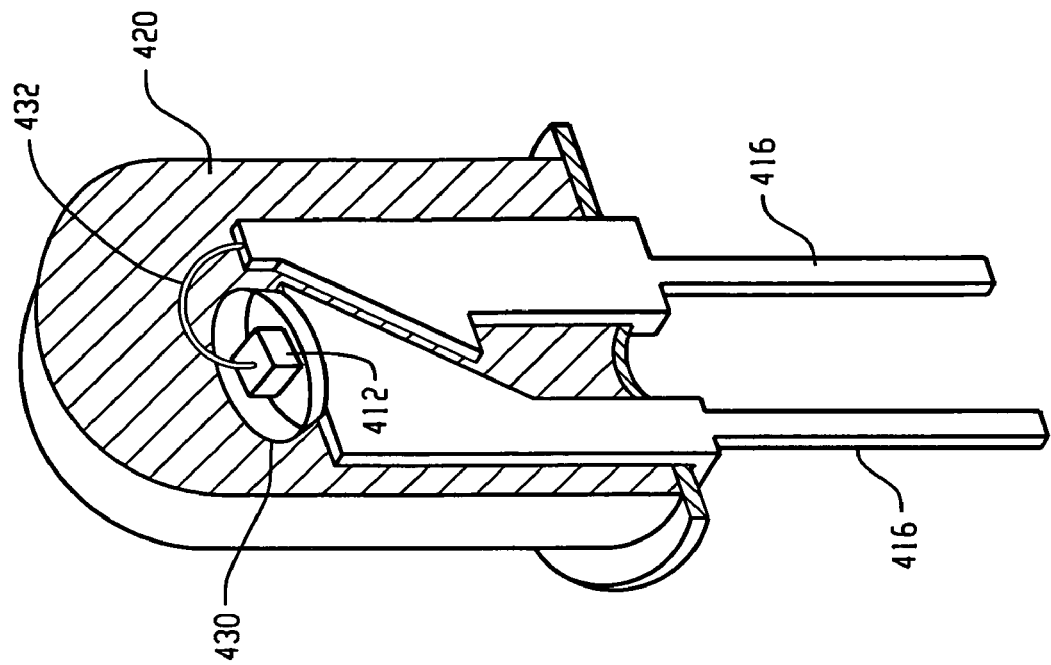
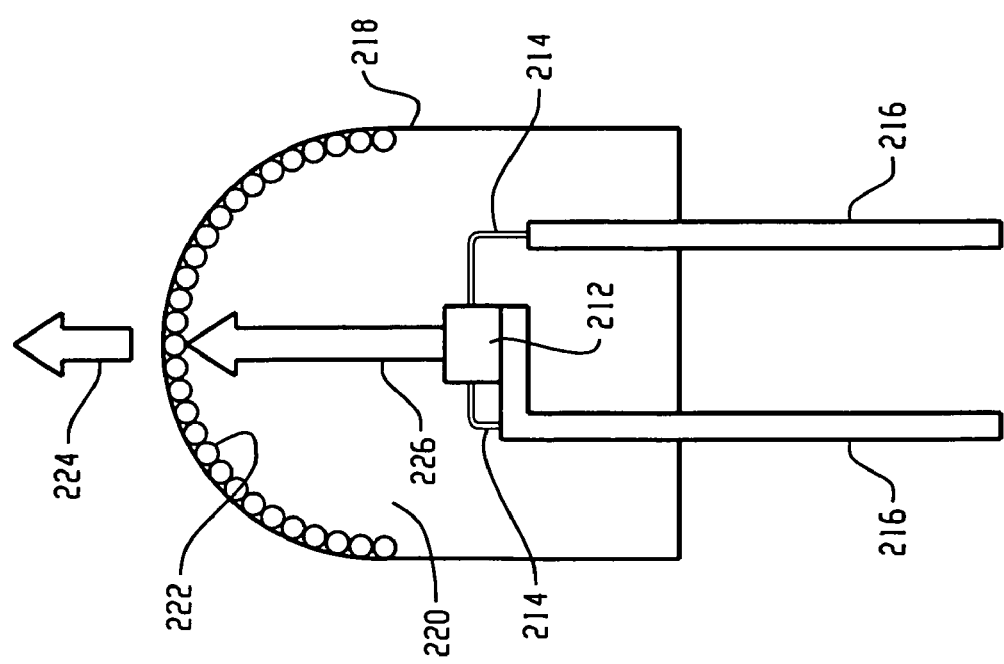

RED EMITTING PHOSPHOR MATERIALS FOR USE IN LED AND LCD APPLICATIONS

BACKGROUND OF THE INVENTION

The present exemplary embodiments relate to phosphor compositions, particularly phosphors for use in lighting applications. More particularly, the present embodiments relate to red emitting phosphors and a lighting apparatus employing these phosphors.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength in the near UV-to-blue range (from about 315 nm to about 480 nm) combined with a yellow light-emitting phosphor, such as cerium doped yttrium aluminum garnet $Y_3Al_5O_{12}:Ce^{3+}$ ("YAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light.

Such systems can be used to make white light sources having correlated color temperatures (CCTs) of >4500 K and color rendering indicies (CRIs) ranging from about 75-82. While this range is suitable for many applications, general illumination sources usually require higher CRIs and lower CCTs.

Other white light LED lighting systems use a UV or visible light LED chip along with a blend of red, green, and/or blue phosphors that can be efficiently excited by near-UV radiation to make white light. Two red phosphors currently being used in such applications are $(Ca,Sr)S:Eu^{2+}$ and $(Ca,Sr,Ba)Si_xN_y:Eu^{2+}$. While somewhat effective, such phosphors may reabsorb emission from other phosphors (e.g. YAG:Ce) that may be present in the illumination device due to the overlapping of the $Eu^{2+}$ absorption bands in these materials with the emission of the other phosphors.

In many white light applications, phosphors with $Eu^{3+}$ line emission are preferred as the red component because it maximizes color rendering while minimizing loss of luminosity. Current $Eu^{3+}$ red fluorescent lamp phosphors cannot be used in UV LED lamps because they have virtually no absorption of near-UV (370-405) light, leading to significant light scattering loss.

Thus, a continuing need exists for new red emitting phosphors for use in conjunction with UV and visible LED chips displaying high quantum efficiency to produce both colored and white-light LEDs having a high CRI. In addition, there exists a need for red phosphors for use in liquid crystal display (LCD) devices.

BRIEF SUMMARY

In a first aspect, there is provided a light emitting device including a semiconductor light source and a phosphor composition including at least one of: (1) $A_{2-x}Eu_xW_{1-y}Mo_yO_6$, where A is selected from Y, Gd, Lu, La, and combinations thereof; and where $0.5 \leq x \leq 1.0$, $0.01 \leq y \leq 1.0$; (2) $M_mO_nX$, wherein M is selected from the group consisting of Sc, Y, La, a lanthanide, an alkali earth metal and mixtures thereof; X is a halogen; $1 \leq m \leq 3$; and $1 \leq n \leq 4$, and having a lanthanide doping level can, range from 0.001% to 40% by weight; or (3) a phosphate or borate phosphor selected from the group consisting of (Y,Gd,Lu,La)PO$_4$; (Y,Gd,Lu,La)P$_3$O$_9$; (Y,Gd,Lu,La)P$_5$O$_{14}$; (Sr,Ba,Ca)3(Lu, Gd,Y,La)P$_3$O$_{12}$; Ca$_{1.5}$Ba$_{1.5}$(La,y,Gd,Lu)P$_3$O$_{12}$; (Y,La,Lu, Gd)BO$_3$; (Gd,Y,LuLa)B$_3$O$_6$; (La,Gd,Lu,Y)(Al,Ga)$_3$B$_4$O$_{12}$; (Y,Gd,Lu,La)MgB$_5$O$_{10}$; (Sr,Ca,Ba)(Lu,Gd,Y,La)B$_7$O$_{13}$; Ca$_{0.5}$Ba$_{0.5}$LaB$_7$O$_{13}$; and blends thereof.

In a second aspect, there is provided a phosphor having the formula $A_{2-x}Eu_xW_{1-y}Mo_yO_6$, where A is selected from Y, Gd, Lu, La, and combinations thereof; and where $0.5 \leq x \leq 1.0$, $0.01 \leq y \leq 1.0$.

In a third aspect, there is provided an $Eu^{3+}$ doped rare earth phosphate or borate phosphor selected from the group consisting of (Y,Gd,Lu,La)PO$_4$:Eu; (Y,Gd,Lu,La)P$_3$O$_9$:Eu; (Y,Gd,Lu,La)P$_5$O$_{14}$:Eu; (Sr,Ba,Ca)3(Lu,Gd,Y,La)P$_3$O$_{12}$:Eu; Ca$_{1.5}$Ba$_{1.5}$(La,y,Gd,Lu)P$_3$O$_{12}$:Eu; (Y,La,Lu,Gd)BO$_3$:Eu;

(Gd,Y,Lu,La)B$_3$O$_6$:Eu; (La,Gd,Lu,Y)(Al,Ga)$_3$B$_4$O$_{12}$:Eu; (Y,Gd,Lu,La)MgB$_5$O$_{10}$:Eu; (Sr,Ca,Ba)(Lu,Gd,Y,La)B$_7$O$_{13}$:Eu; Ca$_{0.5}$Ba$_{0.5}$LaB$_7$O$_{13}$:Eu; and blends thereof.

In a fourth aspect, there is provided a phosphor having the formula M$_m$O$_n$X, wherein M is selected from the group consisting of Sc, Y, La, a lanthanide, an alkali earth metal and mixtures thereof; X is a halogen; $1 \leq m \leq 3$; and $1 \leq n \leq 4$, and having a lanthanide doping level can range from 0.01 to 40% spectral weight.

In a fifth aspect, there is provided an LCD backlight including a phosphor selected from the group consisting of A$_{2-x}$Eu$_x$W$_{1-y}$Mo$_y$O$_6$, where A is selected from Y, Gd, Lu, La, and combinations thereof; and where $0.5 \leq x \leq 1.0$, $0.01 \leq y \leq 1.0$; M$_m$O$_n$X, wherein M is selected from the group consisting of Sc, Y, a lanthanide, an alkali earth metal and mixtures thereof; X is a halogen; $1 \leq m \leq 3$; and $1 \leq n \leq 4$, and wherein the lanthanide doping level can range from 0.001 to 40% by weight; (Y,Gd,Lu,La)PO$_4$; (Y,Gd,Lu,La)P$_3$O$_9$; (Y,Gd,Lu,La)P$_5$O$_{14}$; (Sr,Ba,Ca)3(Lu,Gd,Y,La)P$_3$O$_{12}$; Ca$_{1.5}$Ba$_{1.5}$(La,y,Gd,Lu)P$_3$O$_{12}$; (Y,La,Lu,Gd)BO$_3$; (Gd,Y,LuLa)B$_3$O$_6$; (La,Gd,Lu,Y)(Al,Ga)$_3$B$_4$O$_{12}$; (Y,Gd,Lu,La)MgB$_5$O$_{10}$; (Sr,Ca,Ba)(Lu,Gd,Y,La)B$_7$O$_{13}$; Ca$_{0.5}$Ba$_{0.5}$LaB$_7$O$_{13}$; and blends thereof.

BRIEF DESCRIPTION OF THE DRAWINGS

FIG. 3 is a schematic cross-sectional view of an illumination system in accordance with a third embodiment of the present invention.

FIG. 4 is a cutaway side perspective view of an illumination system in accordance with a fourth embodiment of the present invention.

DETAILED DESCRIPTION OF THE EXEMPLARY EMBODIMENTS

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or visible radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor composition as well as a blend of two or more phosphors unless otherwise noted.

It was determined that an LED lamp that produces a bright-white light would be useful to impart desirable qualities to LEDs as light sources. Therefore, in one embodiment, a luminescent material phosphor conversion material blend (phosphor blend) coated LED chip is disclosed for providing white light. The individual phosphors and a phosphor blend including the individual phosphors convert radiation at a specified wavelength, for example radiation from about 250 to 550 nm as emitted by a near UV or visible LED, into a different wavelength visible light. The visible light provided by the phosphor blend (and LED chip if emitting visible light) comprises a bright white light with high intensity and brightness.

Figure 1:
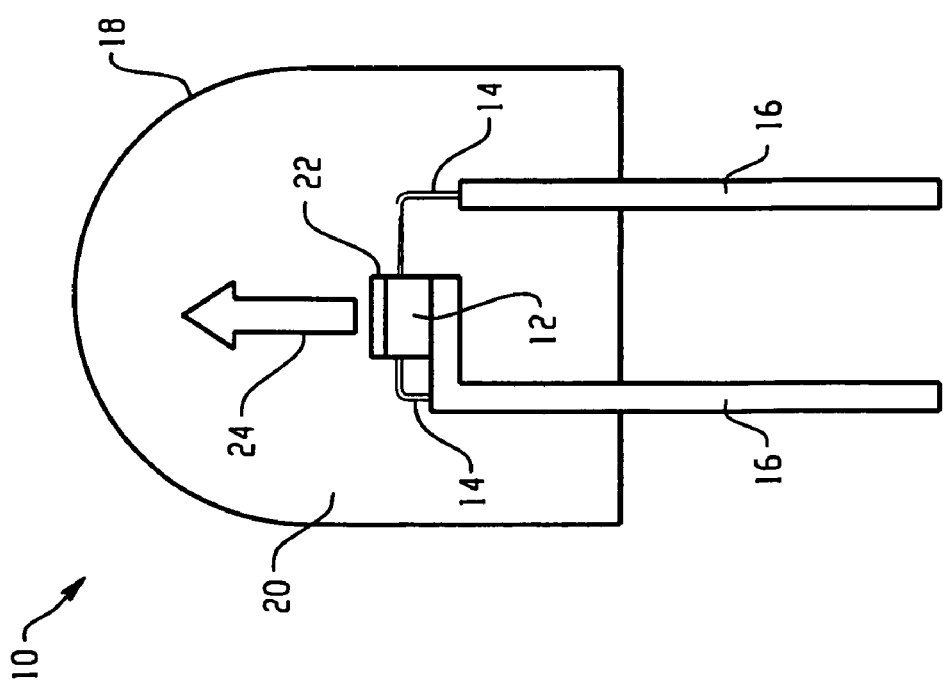
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred emission of the LED chip in the present invention will depend on the identity of the phosphors in the disclosed embodiments. However, the emission of the LED will generally have a wavelength in the range from about 250 to about 550 nm, which corresponds to an emission ranging from UV to green. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 550 nm.

Preferably, the LED may contain at least one semiconductor layer comprising GaN, ZnSe or SiC. For example, the LED may comprise a nitride compound semiconductor represented by the formula In$_i$Ga$_j$Al$_k$N (where $0 \leq i$; $0 \leq j$; $0 \leq k$ and $i+j+k=1$) having an emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below.

This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor composition may be from about 1 to about 10 microns.

Figure 2:
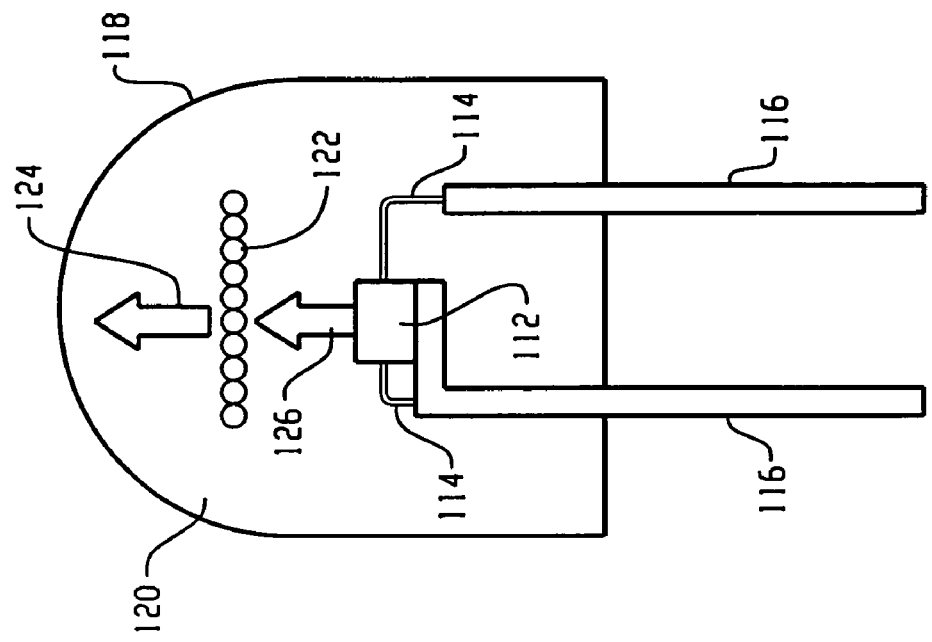
FIG. 2 is a schematic cross-sectional view of an illumination system in accordance with a second embodiment of the present invention.

FIG. 2 illustrates a second exemplary structure of the system. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Radiation 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor-interspersion methods may also be used, such as transfer loading.

FIG. 3 illustrates a third exemplary structure of the system. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The radiation 226 emitted by the LED chip 212 mixes with the light emitted by the phosphor composition 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, there is provided a novel phosphor composition, which may be used in the phosphor composition 22 in the above described LED light, having the general formula $A_{2-x}Eu_xW_{1-y}Mo_yO_6$ where A is selected from Y, Gd, Lu, La, and combinations thereof; and where $0.5 \leq x \leq 1.0$, $0.01 \leq y \leq 1.0$. A particularly preferred phosphor composition has the formula $Y_{1.85}Eu_{0.15}W_{0.98}Mo_{0.02}O_6$. When used with an LED chip emitting at from 350 to 415 nm, the resulting lighting system will produce a light having an orange-red color, the characteristics of which will be discussed in more detail below.

Figure 5:
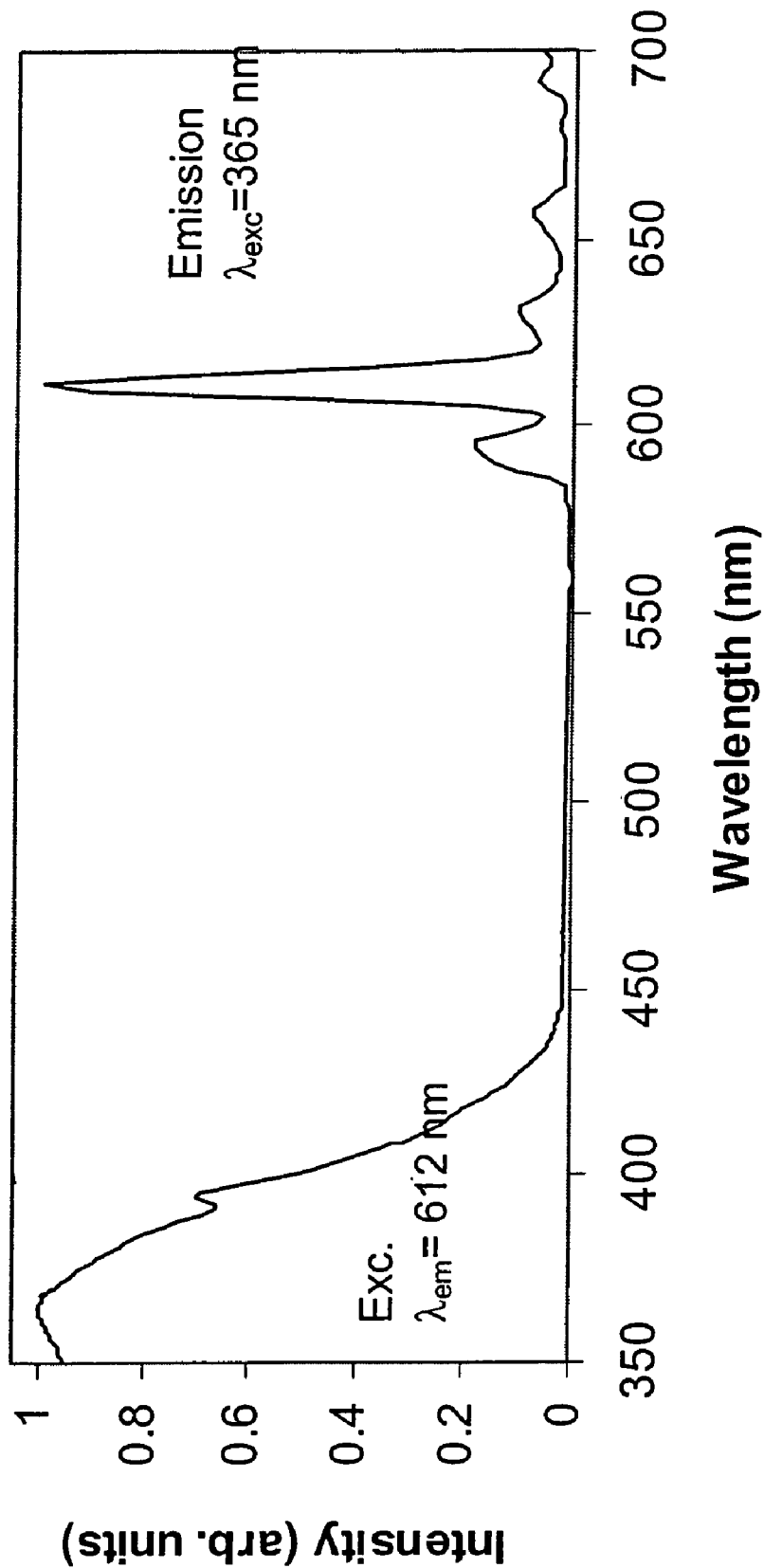
FIG. 5 is a graph of the excitation and emission spectra of a Y$_{1.85}$Eu$_{0.15}$W$_{0.98}$Mo$_{0.2}$O$_6$ phosphor.

When used in conjunction with a near-UV LED chip, the above described formulation produces a phosphor with an emission having a orange-red color. This is shown in FIG. 5, which shows the emission of a phosphor having the formula $Y_{1.85}Eu_{0.15}W_{0.98}Mo_{0.02}O_6$. As can be seen, the emission spectrum using a 365 nm excitation shows typical $Eu^{3+}$ line emissions and the excitation spectrum for $Eu^{3+}$ emission shows a peak at about 360 nm corresponding to $(MoO_4)^{2-}$ absorption. The low intensity of the $Eu^{3+}$ f-f transition in the excitation spectrum signifies reasonable energy transfer between $(MoO_4)^{2-}$ and $Eu^{3+}$. In addition, there appears to be a significant tail into the near-UV in the excitation spectrum. This is also shown in the relatively high absorption values at 390 nm, which is much lower in wavelength compared to the excitation maximum. The relevant optical parameters for this phosphor are given below:

Relative QE vs $YVO_4$:$Eu^{3+}$ at 350 nm excitation: 50%

Relative QE vs $Y_2O_3$:$Eu^{3+}$ at 254 nm excitation: 40%

Absorption at 365 nm (6 micron median particle size): 77%

Absorption at 395 nm (6 micron median particle size): 50%

Absorption at 395 nm (as fired phosphor): 65% x, y coordinates on CIE chromaticity diagram: 0.655, 0.345

Ipw (rad): 234 lm/W

The emission of $Y_{1.85}Eu_{0.15}W_{0.98}Mo_{0.02}O_6$ excited by a UV LED is typically orange-red with reduced UV scattering as evidenced by a lack of purple scattered lighted of the powdered surface.

When combined with a LED chip emitting at from 350-415 nm and one or more additional phosphors (such as blue and green emitting phosphors), the use of the above phosphor allows for a white LED. The additional phosphors that can be used with the above described $Y_{1.85}Eu_{0.15}W_{0.98}Mo_{0.02}O_6$ are described in more detail below.

Figure 6:
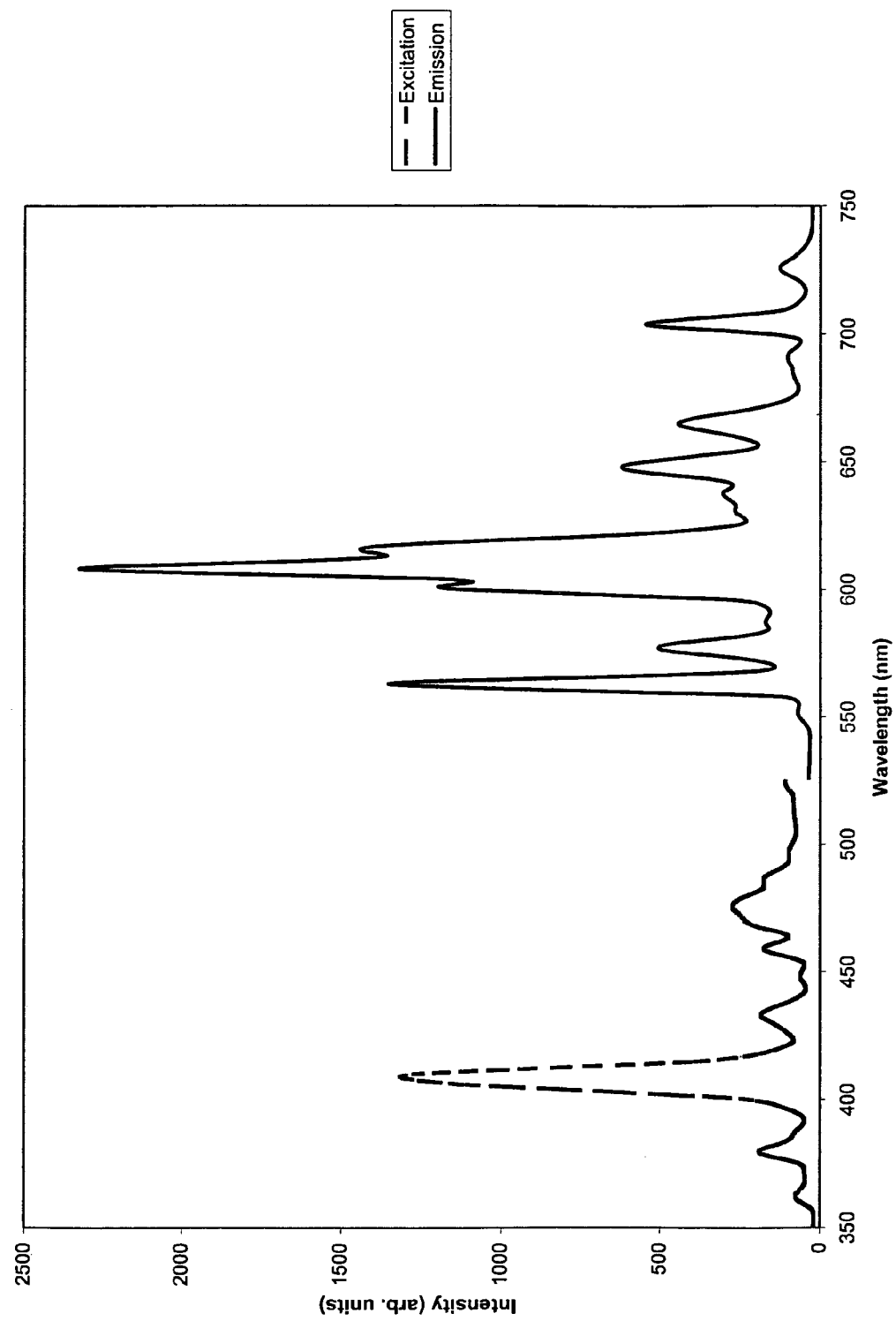
FIG. 6 is a graph of the excitation and emission spectra of (La$_{0.985}$Sm$_{0.01}$Ce$_{0.005}$)OBr.

In a second embodiment, the phosphor includes a phosphor composition having the formula $M_mO_nX$, wherein M is selected from the group consisting of Sc, Y, La, a lanthanide, an alkali earth metal and mixtures thereof; X is a halogen; $1 \leq m \leq 3$; and $1 \leq n \leq 4$, and having a lanthanide doping level ranging from 0.001 to 40% by weight. One preferred composition of this embodiment has the formula $(La_{0.985}Sm_{0.01}Ce_{0.005})OBr$. In this embodiment, the associated LED chip preferably has an emission in the range of from about 235 to 550 nm. FIG. 6 shows the excitation and emission spectra of the above preferred composition, using an excitation wavelength of 408 nm for the latter. This composition was prepared by firing a mixture of 10.2493 g $La_2O_3$, 8.0110 g $NH_4Br$, 1.1231 g KBr, 0.0735 g $Ce_2(CO_3)_3$ and 0.1114 g $Sm_2O_3$ in reducing atmosphere.

In a third embodiment, the phosphor composition includes an $Eu^{3+}$ activated phosphate and/or borate phosphor. The amount of $Eu^{3+}$ doping can range from 0 to 50 weight %, but typically will be from about 0.005 to 5%. As used herein, the term "phosphate" refers not only to orthophosphates, but also to metaphosphates, pentaphosphates (or ultraphosphates), and the like. Similarly, the term "borate" refers to metaborates, orthoborates, tetraborates, pentaborates and the like. Phosphor compositions according to this embodiment include $(Y,Gd,Lu,La)PO_4$; $(Y,Gd,Lu,La)P_3O_9$; $(Y,Gd,Lu,La)P_5O_{14}$; $(Sr,Ba,Ca)_3(Lu,Gd,Y,La)P_3O_{12}$; $Ca_{1.5}Ba_{1.5}(La,y,Gd,Lu)P_3O_{12}$; $(Y,La,Lu,Gd)BO_3$; $(Gd,Y,LuLa)B_3O_6$; $(La,Gd,Lu,Y)(Al,Ga)_3B_4O_{12}$; $(Y,Gd,Lu,La)MgB_5O_{10}$; $(Sr,Ca,Ba)(Lu,Gd,Y,La)B_7O_{13}$; $Ca_{0.5}Ba_{0.5}LaB_7O_{13}$; and blends thereof. In this embodiment, the LED preferably has a primary emission in the region of from 370 to 450 nm. Preferred compositions of this embodiment are detailed below in Table 1, along with the raw materials used to create 15 g of the sample. All solutions listed in Table 1 are 0.5 M.

TABLE 1

| ID# | SAMPLES | RAW MATERIALS FOR 15 g OF SAMPLE |
|---|---|---|
| 1 | $LaPO_4$ | 128.27 ml $La(NO_3)_3$; 141.12 ml $(NH_4)_3PO_4$ |
| 2 | $La_{0.95}Eu_{0.05}PO_4$ | 121.52 ml $La(NO_3)_3$; 6.41 ml $Eu(NO_3)_3$; 140.71 ml $(NH_4)_3PO_4$ |
| 3 | $GdPO_4$ | 118.55 ml $Gd(NO_3)_3$; 130.8 ml $(NH_4)_3PO_4$ |
| 4 | $Gd_{0.95}Eu_{0.05}PO_4$ | 113.1 ml $Gd(NO_3)_3$; 5.94 ml $Eu(NO_3)_3$; 131.01 ml $(NH_4)_3PO_4$ |
| 5 | $Gd_{0.8}Eu_{0.2}PO_4$ | 95.56 ml $Gd(NO_3)_3$; 23.93 ml $Eu(NO_3)_3$; 131.37 ml $(NH_4)_3PO_4$ |
| 6 | $YPO_4$ | 163.2 ml $Y(NO_3)_3$; 179.52 ml $(NH_4)_3PO_4$ |
| 7 | $Y_{0.95}Eu_{0.05}PO_4$ | 152.36 ml $Y(NO_3)_3$; 8.02 ml $Eu(NO_3)_3$; 176.45 ml $(NH_4)_3PO_4$ |
| 8 | $LaP_3O_9$ | 6.5 g $La_2O_3$; 13.774 g $NH_4H_2PO_4$ |
| 9 | $La_{0.95}Eu_{0.05}P_3O_9$ | 6.165 g $Ln_2O_3$; 0.3505 g $Eu_2O_3$; 13.746 g $NH_4H_2PO_4$ |
| 10 | $GdP_3O_9$ | 6.898 g $Gd_2O_3$; 13.134 g $NH_4H_2PO_4$ |
| 11 | $Gd_{0.95}Eu_{0.05}P_3O_9$ | 6.558 g $Gd_2O_3$; 0.335 g $Eu_2O_3$; 13.14 g $NH_4H_2PO_4$ |
| 12 | $Gd_{0.8}Eu_{0.2}P_3O_9$ | 5.533 g $Gd_2O_3$; 1.343 g $Eu_2O_3$; 13.168 g $NH_4H_2PO_4$ |
| 13 | $YP_3O_9$ | 5.228 g $Y_2O_3$; 15.794 g $NH_4H_2PO_4$ |
| 14 | $Y_{0.95}Eu_{0.05}P_3O_9$ | 4.891 g $Y_2O_3$; 0.401 g $Eu_2O_3$; 15.735 g $NH_4H_2PO_4$ |
| 15 | $LaP_5O_{14}$ | 4.719 g $La_2O_3$; 28.68 g $(NH_4)_2HPO_4$ |
| 16 | $La_{0.95}Eu_{0.05}P_5O_{14}$ | 4.479 g $La_2O_3$; 0.255 g $Eu_2O_3$; 28.68 g $(NH_4)_2HPO_4$ |
| 17 | $GdP_5O_{14}$ | 5.07 g $Gd_2O_3$; 27.71 g $(NH_4)_2HPO_4$ |
| 18 | $Gd_{0.95}Eu_{0.05}P_5O_{14}$ | 4.82 g $Gd_2O_3$; 0.246 g $Eu_2O_3$; 27.71 g $(NH_4)_2HPO_4$ |
| 19 | $Gd_{0.8}Eu_{0.2}P_5O_{14}$ | 4.06 g $La_2O_3$; 0.9871 g $Eu_2O_3$; 27.71 g $(NH_4)_2HPO_4$ |
| 20 | $YP_5O_{14}$ | 3.68 g $Y_2O_3$; 31.76 g $(NH_4)_2HPO_4$ |
| 21 | $Y_{0.95}Eu_{0.05}P_5O_{14}$ | 3.42 g $Y_2O_3$; 0.2804 g $Eu_2O_3$; 31.76 g $(NH_4)HPO_4$ |
| 22 | $Ca_3(PO_4)_2LaPO_4$ | 55.14 ml $La(NO_3)_3$; 165.42 ml $Ca(NO_3)_2$; 181.96 ml $(NH_4)_3PO_4$ |
| 23 | $Ca_3(PO_4)La_{0.95}Eu_{0.05}PO_4$ | 52.02 ml $La(NO_3)_3$; 2.76 ml $Eu(NO_3)_3$; 165.2 ml $Ca(NO_3)_2$; 181.72 ml $(NH_4)_3PO_4$ |
| 24 | $Ca_3(PO_4)_2GdPO_4$ | 53.34 ml $Gd(NO_3)_3$; 160.02 ml $Ca(NO_3)_2$; 176.02 ml $(NH_4)_3PO_4$ |
| 25 | $Ca_3(PO_4)_2Gd_{0.95}Eu_{0.05}PO_4$ | 50.7 ml $Gd(NO_3)_3$; 2.67 ml $Eu(NO_3)_3$; 160.1 ml $Ca(NO_3)_2$; 176.11 ml $(NH_4)_3PO_4$ |
| 26 | $Ca_3(PO_4)_2Gd_{0.8}Eu_{0.2}PO_4$ | 42.75 ml $Gd(NO_3)_3$; 10.7 ml $Eu(NO_3)_3$; 160.32 ml $Ca(NO_3)_2$; 176.352 ml $(NH_4)_3PO_4$ |
| 27 | $Sr_3(PO_4)_2LaPO_4$ | 43.68 ml $La(NO_3)_3$; 131.08 ml $Sr(NO_3)_2$; 144.18 ml $(NH_4)_3PO_4$ |
| 28 | $Sr_3(PO_4)La_{0.95}Eu_{0.05}PO_4$ | 41.46 ml $La(NO_3)_3$; 2.184 ml $Eu(NO_3)_3$; 130.96 ml $Sr(NO_3)_2$; 144.05 ml $(NH_4)_3PO_4$ |
| 29 | $Sr_3(PO_4)_2GdPO_4$ | 42.6 ml $Gd(NO_3)_3$; 127.64 ml $Sr(NO_3)_2$; 140.42 ml $(NH_4)_3PO_4$ |
| 30 | $Sr_3(PO_4)_2Gd_{0.95}Eu_{0.05}PO_4$ | 40.44 ml $Gd(NO_3)_3$; 2.134 ml $Eu(NO_3)_3$; 127.72 ml $Sr(NO_3)_2$; 140.48 ml $(NH_4)_3PO_4$ |
| 31 | $Sr_3(PO_4)_2Gd_{0.8}Eu_{0.2}PO_4$ | 34.07 ml $Gd(NO_3)_3$; 8.54 ml $Eu(NO_3)_3$; 127.86 ml $Sr(NO_3)_2$; 140.65 ml $(NH_4)_3PO_4$ |
| 32 | $Ca_{1.5}Ba_{1.5}(PO_4)_2LaPO_4$ | 43.5 ml $La(NO_3)_3$; 65.2 ml $Ca(NO_3)_2$; 130.44 ml $Ba(NO_3)_2$ 0.25 M; 143.48 ml $(NH_4)_3PO_4$ |
| 33 | $Ca_{1.5}Ba_{1.5}(PO_4)_2La_{0.95}Eu_{0.05}PO_4$ | 41.3 ml $La(NO_3)_3$; 65.16 ml $Ca(NO_3)_2$; 130.32 ml $Ba(NO_3)_2$ 0.25 M; 2.16 ml $Eu(NO_3)_3$; 143.35 ml $(NH_4)_3PO_4$ |
| 34 | $Ca_{1.5}Ba_{1.5}(PO_4)_2GdPO_4$ | 42.4 ml $Gd(NO_3)_3$; 63.54 ml $Ca(NO_3)_2$; 127.08 ml $Ba(NO_3)_2$ 0.25 M; 13979 ml $(NH_4)_3PO_4$ |

TABLE 1-continued

| ID# | SAMPLES | RAW MATERIALS FOR 15 g OF SAMPLE |
|---|---|---|
| 35 | $Ca_{1.5}Ba_{1.5}(PO_4)_2Gd_{0.95}Eu_{0.05}PO_4$ | 40.3 ml $Gd(NO_3)_3$; 63.54 ml $Ca(NO_3)_2$; 127.08 ml $Ba(NO_3)_2$ 0.25 M; 2.118 ml $Eu(NO_3)_3$; 139.82 ml $(NH_4)_3PO_4$ |
| 36 | $Ca_{1.5}Ba_{1.5}(PO_4)_2Gd_{0.8}Eu_{0.2}PO_4$ | 33.9 ml $Gd(NO_3)_3$; 63.64 ml $Ca(NO_3)_2$; 127.28 ml $Ba(NO_3)_2$ 0.25 M; 8.49 ml $Eu(NO_3)_3$; 139.99 ml $(NH_4)_3PO_4$ |
| 37 | $Ba_3(PO_4)_2LaPO_4$ | 35.92 ml $La(NO_3)_3$; 215.34 ml 0.25M $Ba(NO_3)_2$; 118.44 ml $(NH_4)_3PO_4$ |
| 38 | $Ba_3(PO_4)_2La_{0.95}Eu_{0.05}PO_4$ | 34.1 ml $La(NO_3)_3$; 1.794 ml $Eu(NO_3)_3$; 215.19 ml 0.25M $Ba(NO_3)_2$; 118.35 ml $(NH_4)_3PO_4$ |
| 39 | $Ba_3(PO_4)_2GdPO_4$ | 35.12 ml $Gd(NO_3)_3$; 210.74 ml 0.25M $Ba(NO_3)_2$; 115.9 ml $(NH_4)_3PO_4$ |
| 40 | $Ba_3(PO_4)_2Gd_{0.95}Eu_{0.05}PO_4$ | 33.4 ml $Gd(NO_3)_3$; 1.755 ml $Eu(NO_3)_3$; 210.78 ml 0.25M $Ba(NO_3)_2$; 115.929 ml $(NH_4)_3PO_4$ |
| 41 | $Ba_3(PO_4)_2Gd_{0.8}Eu_{0.2}PO_4$ | 28.14 ml $Gd(NO_3)_3$; 210.996 ml $Ba(NO_3)_2$ 0.25 M; 7.02 ml $Eu(NO_3)_3$; 116.04 ml $(NH_4)_3PO_4$ |
| 42 | $Ca_3(PO_4)_2YPO_4$ | 60.72 ml $Y(NO_3)_3$; 182.16 ml $Ca(NO_3)_2$; 200.4 ml $(NH_4)_3PO_4$ |
| 43 | $Ca_3(PO_4)_2Y_{0.95}Eu_{0.05}PO_4$ | 57.3 ml $Y(NO_3)_3$; 3.015 ml $Eu(NO_3)_3$; 181.02 ml $Ca(NO_3)_2$; 99.56 ml $(NH_4)_3PO_4$ |
| 44 | $Sr_3(PO_4)_2YPO_4$ | 46.5 ml $Y(NO_3)_3$; 141.36 ml $Sr(NO_3)_2$; 155.5 ml $(NH_4)_3PO_4$ |
| 45 | $Sr_3(PO_4)_2Y_{0.95}Eu_{0.05}PO_4$ | 44.54 ml $Y(NO_3)_3$; 2.34 ml $Eu(NO_3)_3$; 140.66 ml $Sr(NO_3)_2$; 154.74 ml $(NH_4)_3PO_4$ |
| 46 | $Ca_{1.5}Ba_{1.5}(PO_4)_2YPO_4$ | 46.88 ml $Y(NO_3)_3$; 70.32 ml $Ca(NO_3)_2$; 140.64 ml $Ba(NO_3)_2$ 0.25 M; 154.7 ml $(NH_4)_3PO_4$ |
| 47 | $Ca_{1.5}Ba_{1.5}(PO_4)_2Y_{0.95}Eu_{0.05}PO_4$ | 44.31 ml $Y(NO_3)_3$; 69.96 ml $Ca(NO_3)_2$; 139.92 ml $Ba(NO_3)_2$ 0.25 M; 2.331 ml $Eu(NO_3)_3$; 153.945 ml $(NH_4)_3PO_4$ |
| 48 | $Ba_3(PO_4)_2YPO_4$ | 38.18 ml $Y(NO_3)_3$; 229.08 ml 0.25M $Ba(NO_3)_2$; 125.99 ml $(NH_4)_3PO_4$ |
| 49 | $Ba_3(PO_4)_2Y_{0.95}Eu_{0.05}PO_4$ | 36.12 ml $Y(NO_3)_3$; 1.902 ml $Eu(NO_3)_3$; 228.15 ml 0.25M $Ba(NO_3)_2$; 125.48 ml $(NH_4)_3PO_4$ |
| 50 | $LaBO_3$ | 303.47 ml $La(NO_3)_3$; 303.47 ml $H_3BO_3$ |
| 51 | $La_{0.95}Eu_{0.05}BO_3$ | 287.34 ml $La(NO_3)_3$; 15.12 ml $Eu(NO_3)_3$; 302.48 ml $H_3BO_3$ |
| 52 | $GdBO_3$ | 277.70 ml $Gd(NO_3)_3$; 277.70 ml $H_3BO_3$ |
| 53 | $Gd_{0.95}Eu_{0.05}BO_3$ | 264.18 ml $Gd(NO_3)_3$; 13.91 ml $Eu(NO_3)_3$; 278.08 ml $H_3BO_3$ |
| 54 | $Gd_{0.8}Eu_{0.2}BO_3$ | 223.25 ml $Gd(NO_3)_3$; 55.92 ml $Eu(NO_3)_3$; 279.08 ml $H_3BO_3$ |
| 55 | $YBO_3$ | 406.17 ml $Y(NO_3)_3$; 406.17 ml $H_3BO_3$ |
| 56 | $Y_{0.95}Eu_{0.05}BO_3$ | 377.82 ml $Y(NO_3)_3$; 19.89 ml $Eu(NO_3)_3$; 397.71 ml $H_3BO_3$ |
| 57 | $La(BO_2)_3$ | 9.141 g $La_2O_3$; 10.41 g $H_3BO_3$ |
| 58 | $La_{0.95}Eu_{0.05}(BO_2)_3$ | 8.662 g $La_2O_3$; 0.492 g $Eu_2O_3$; 10.383 g $H_3BO_3$ |
| 59 | $Gd(BO_2)_3$ | 9.517 g $Gd_2O_3$; 9.740 g $H_3BO_3$ |
| 60 | $Gd_{0.95}Eu_{0.05}(BO_2)_3$ | 9.049 g $Gd_2O_3$; 0.462 g $Eu_2O_3$; 9.749 g $H_3BO_3$ |
| 61 | $Gd_{0.8}Eu_{0.2}(BO_2)_3$ | 7.642 g $Gd_2O_3$; 1.855 g $Eu_2O_3$; 9.776 g $H_3BO_3$ |
| 62 | $Y(BO_2)_3$ | 7.792 g $Y_2O_3$; 12.803 g $H_3BO_3$ |
| 63 | $Y_{0.95}Eu_{0.05}(BO_2)_3$ | 7.297 g $Y_2O_3$; 0.598 g $Eu_2O_3$; 12.619 g $H_3BO_3$ |
| 64 | $YAl_3B_4O_{12}$ | 4.180 g $Y_2O_3$; 9.158 g $H_3BO_3$; 111.1 ml $Al(NO_3)_3$ |
| 65 | $Y_{0.95}Eu_{0.05}Al_3B_4O_{12}$ | 3.940 g $Y_2O_3$; 0.323 g $Eu_2O_3$; 9.088 g $H_3BO_3$; 110.2 ml $Al(NO_3)_3$ |
| 66 | $GdAl_3B_4O_{12}$ | 5.740 g $Gd_2O_3$; 7.836 g $H_3BO_3$; 95.1 ml $Al(NO_3)_3$ |
| 67 | $Gd_{0.95}Eu_{0.05}Al_3B_4O_{12}$ | 5.458 g $Gd_2O_3$; 0.279 g $Eu_2O_3$; 7.841 g $H_3BO_3$; 95.1 ml $Al(NO_3)_3$ |
| 68 | $Gd_{0.8}Eu_{0.2}Al_3B_4O_{12}$ | 4.604 g $Gd_2O_3$; 1.118 g $Eu_2O_3$; 7.854 g $H_3BO_3$; 95.26 ml $Al(NO_3)_3$ |
| 69 | $YGa_3B_4O_{12}$ | 3.170 g $Y_2O_3$; 6.961 g $H_3BO_3$; 84.38 ml $Ga(NO_3)_3$ |
| 70 | $Y_{0.95}Eu_{0.05}Ga_3B_4O_{12}$ | 2.999 g $Y_2O_3$; 0.246 g $Eu_2O_3$; 6.922 g $H_3BO_3$; 83.88 ml $Ga(NO_3)_3$ |
| 71 | $GdGa_3B_4O_{12}$ | 4.520 g $Gd_2O_3$; 6.166 g $H_3BO_3$; 74.79 ml $Ga(NO_3)_3$ |
| 72 | $Gd_{0.95}Eu_{0.05}Ga_3B_4O_{12}$ | 4.295 g $Gd_2O_3$; 0.219 g $Eu_2O_3$; 6.169 g $H_3BO_3$; 74.800 ml $Ga(NO_3)_3$ |
| 73 | $Gd_{0.8}Eu_{0.2}Ga_3B_4O_{12}$ | 3.620 g $Gd_2O_3$; 1.879 g $Eu_2O_3$; 6.177 g $H_3BO_3$; 74.83 ml $Ga(NO_3)_3$ |
| 74 | $LaMgB_5O_{10}$ | 6.477 g $La_2O_3$; 3.665 g $MgCO_3(OH)$; 12.293 g $H_3BO_3$ |
| 75 | $La_{0.95}MgEu_{0.05}B_5O_{10}$ | 6.143 g $La_2O_3$; 3.658 g $MgCO_3(OH)$; 0.349 g $Eu_2O_3$; 12.272 g $H_3BO_3$ |
| 76 | $GdMgB_5O_{10}$ | 6.870 g $Gd_2O_3$; 3.495 g $MgCO_3(OH)$; 11.723 g $H_3BO_3$ |
| 77 | $Gd_{0.95}MgEu_{0.05}B_5O_{10}$ | 6.533 g $Gd_2O_3$; 3.497 g $MgCO_3(OH)$; 0.334 g $Eu_2O_3$; 11.730 g $H_3BO_3$ |
| 78 | $Gd_{0.8}MgEu_{0.2}B_5O_{10}$ | 5.513 g $Gd_2O_3$; 3.504 g $MgCO_3(OH)$; 1.338 g $Eu_2O_3$; 11.754 g $H_3BO_3$ |
| 79 | $YMgB_5O_{10}$ | 5.175 g $Y_2O_3$; 4.224 g $MgCO_3(OH)$; 14.171 g $H_3BO_3$ |

TABLE 1-continued

| ID# | SAMPLES | RAW MATERIALS FOR 15 g OF SAMPLE |
|---|---|---|
| 80 | $Y_{0.95}MgEu_{0.05}B_5O_{10}$ | 4.860 g $Y_2O_3$; 4.184 g $MgCO_3(OH)$; 0.399 g $Eu_2O_3$; 14.036 g $H_3BO_3$ |
| 81 | $CaLaB_7O_{13}$ | 5.282 g $La_2O_3$; 3.245 g $CaCO_3$; 14.033 g $H_3BO_3$ |
| 82 | $CaLa_{0.95}Eu_{0.05}B_7O_{13}$ | 5.010 g $La_2O_3$; 3.240 g $CaCO_3$; 0.285 g $Eu_2O_3$; 14.013 g $H_3BO_3$ |
| 83 | $CaGdB_7O_{13}$ | 5.652 g $Gd_2O_3$; 3.121 g $CaCO_3$; 13.498 g $H_3BO_3$ |
| 84 | $CaGd_{0.95}Eu_{0.05}B_7O_{13}$ | 5.372 g $Gd_2O_3$; 3.123 g $CaCO_3$; 0.274 g $Eu_2O_3$; 13.505 g $H_3BO_3$ |
| 85 | $CaGd_{0.8}Eu_{0.2}B_7O_{13}$ | 4.532 g $Gd_2O_3$; 3.125 g $CaCO_3$; 1.100 g $Eu_2O_3$; 13.527 g $H_3BO_3$ |
| 86 | $SrLaB_7O_{13}$ | 4.785 g $La_2O_3$; 4.336 g $SrCO_3$; 12.713 g $H_3BO_3$ |
| 87 | $SrLa_{0.95}Eu_{0.05}B_7O_{13}$ | 4.545 g $La_2O_3$; 4.336 g $SrCO_3$; 0.258 g $Eu_2O_3$; 12.712 g $H_3BO_3$ |
| 88 | $SrGdB_7O_{13}$ | 5.145 g $Gd_2O_3$; 4.191 g $SrCO_3$; 12.287 g $H_3BO_3$ |
| 89 | $SrGd_{0.95}Eu_{0.05}B_7O_{13}$ | 4.890 g $Gd_2O_3$; 4.193 g $SrCO_3$; 0.250 g $Eu_2O_3$; 12.293 g $H_3BO_3$ |
| 90 | $SrGd_{0.8}Eu_{0.2}B_7O_{13}$ | 4.124 g $Gd_2O_3$; 4.199 g $SrCO_3$; 1.001 g $Eu_2O_3$; 12.310 g $H_3BO_3$ |
| 91 | $Ca_{0.5}Ba_{0.5}LaB_7O_{13}$ | 4.785 g $La_2O_3$; 1.470 g $CaCO_3$; 2.898 g $BaCO_3$; 12.713 g $H_3BO_3$ |
| 92 | $Ca_{0.5}Ba_{0.5}La_{0.95}Eu_{0.05}B_7O_{13}$ | 4.534 g $La_2O_3$; 1.466 g $CaCO_3$; 2.891 g $BaCO_3$; 0.258 g $Eu_2O_3$; 12.682 g $H_3BO_3$ |
| 93 | $Ca_{0.5}Ba_{0.5}GdB_7O_{13}$ | 5.133 g $Gd_2O_3$; 1.417 g $CaCO_3$; 2.794 g $BaCO_3$; 12.259 g $H_3BO_3$ |
| 94 | $Ca_{0.5}Ba_{0.5}Gd_{0.95}Eu_{0.05}B_7O_{13}$ | 4.879 g $Gd_2O_3$; 1.418 g $CaCO_3$; 2.796 g $BaCO_3$; 0.250 g $Eu_2O_3$; 12.265 g $H_3BO_3$ |
| 95 | $Ca_{0.5}Ba_{0.5}Gd_{0.8}Eu_{0.2}B_7O_{13}$ | 4.110 g $Gd_2O_3$; 1.420 g $CaCO_3$; 2.800 g $BaCO_3$; 0.999 g $Eu_2O_3$; 12.283 g $H_3BO_3$ |
| 96 | $BaLaB_7O_{13}$ | 4.364 g $La_2O_3$; 5.287 g $BaCO_3$; 11.596 g $H_3BO_3$ |
| 97 | $BaLa_{0.95}Eu_{0.05}B_7O_{13}$ | 4.140 g $La_2O_3$; 5.281 g $BaCO_3$; 0.235 g $Eu_2O_3$; 11.530 g $H_3BO_3$ |
| 98 | $BaGdB_7O_{13}$ | 4.700 g $Gd_2O_3$; 5.119 g $BaCO_3$; 11.228 g $H_3BO_3$ |
| 99 | $BaGd_{0.95}Eu_{0.05}B_7O_{13}$ | 4.469 g $Gd_2O_3$; 5.120 g $BaCO_3$; 0.228 g $Eu_2O_3$; 11.230 g $H_3BO_3$ |
| 100 | $BaGd_{0.8}Eu_{0.2}B_7O_{13}$ | 3.768 g $Gd_2O_3$; 5.128 g $BaCO_3$; 0.915 g $Eu_2O_3$; 11.248 g $H_3BO_3$ |

Of the above, the most preferred phosphors are those labeled 3, 5, 12, 19, 26, 31, 36, 41, 43, 51, 54, 65, 67, 68, 85, 92, and 95. These displayed the greatest intensity (as determined by the integration of the emission spectra in the area of 525 to 725 nm) under UV excitation.

Figure 7:
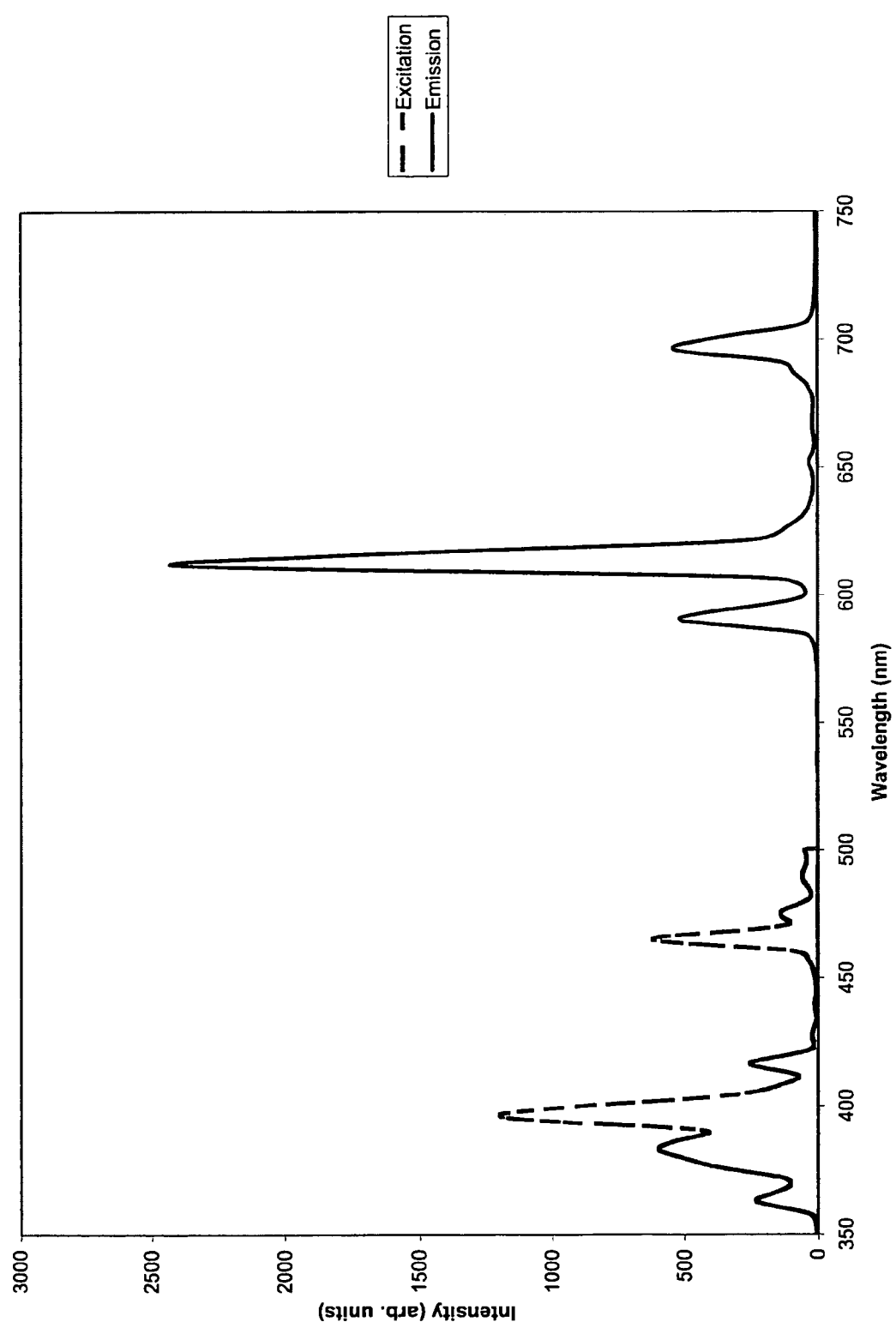
FIG. 7 is a graph of the excitation and emission spectra of (Gd$_{0.8}$Eu$_{0.2}$Al$_3$B$_4$O$_{12}$).

FIG. 7 shows the excitation and emission spectra of phosphor number 68 ($Gd_{0.8}Eu_{0.2}Al_3B_4O_{12}$) when excited by 390 nm UV light.

The above described phosphor compositions may be produced using known solution or solid state reaction processes for the production of phosphors by combining, for example, elemental oxides, carbonates and/or hydroxides as starting materials. Other starting materials may include nitrates, sulfates, acetates, citrates, or oxalates. Thus, according to one method for producing the above described $Y_{1.85}Eu_{0.15}W_{0.98}Mo_{0.02}O_6$ phosphor, stoichiometric amounts of $Y_2O_3$, $Eu_2O_3$, $MoO_3$, and $WO_3$ may be mixed and fired together. Alternately, coprecipitates of the rare earth oxides could be used as the starting materials for the RE elements. In a typical process, the starting materials are combined via a dry or wet blending process and fired in air or under a slightly reducing atmosphere at from, e.g., 1000 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The crucible containing the mixture may be packed in a second closed crucible containing high-purity carbon particles and fired in air so that the carbon particles react with the oxygen present in air, thereby, generating carbon monoxide for providing a reducing atmosphere when needed—e.g. in the case of phosphors doped with $Ce^{3+}$. Alternatively, the reducing atmosphere may comprise a reducing gas such as hydrogen, carbon monoxide or a combination thereof, optionally diluted with an inert gas such as nitrogen, argon, or a combination thereof.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

In another exemplary method of preparation, particularly suited for the preparation of orthophosphates, solutions of rare earth nitrates were obtained through the dissolution of $RE_2O_3$ in nitric acid diluted 1:1 with deionized water. The required volume of the respective nitrate solution(s) are heated to 70° C. with subsequent addition with stirring of $(NH_4)_3PO_4$ to precipitate the orthophosphate using a 10% excess in reference to the calculated amount derived from the chemical equation $$RE(NO_3)_3 + (NH_4)_3PO_4 \rightarrow REPO_4 + 3NH_4NO_3$$

After precipitation, heating of the precipitate for 30 minutes was continued. The precipitate was then washed, filtered and dried. The powders were crushed and heated at 1000° C. for 2 hours in air. The above described processes are merely exemplary of methods of making the phosphors and others are possible.

While suitable in many applications alone with an appropriate LED chip, the above phosphors may be blended with each other or one or more additional phosphors for use in LED light sources. Thus, in another embodiment, an LED lighting assembly is provided including a phosphor composition comprising a blend of a phosphor from one of the above embodiments with one or more additional phosphors. When used in a lighting assembly in combination with a green to near UV LED emitting radiation in the range of about 235 to 550 nm, the resultant light emitted by the assembly will be a white light. In one embodiment, the phosphor composition comprises a blend of the two phosphors $Y_{1.85}Eu_{0.15}W_{0.98}Mo_{0.02}O_6$, as described above, with a blue and a green emitting phosphor and optionally one or more additional phosphors.

The relative amounts of each phosphor in the phosphor composition can be described in terms of spectral weight.

The spectral weight is the relative amount that each phosphor contributes to the overall emission spectra of the phosphor blend. The spectral weight amounts of all the individual phosphors should add up to 1. A preferred blend comprises a spectral weight of from 0.001 to 0.200 of a blue phosphor, from 0.001 to 0.300 of a green phosphor, and the balance of the blend being one of the above described red emitting phosphors. Any known blue and green phosphor suitable for use in near-UV to green LED systems may be used. In addition, other phosphors such as red, blue-green, yellow, or other color phosphors may be used in the blend to customize the white color of the resulting light. While not intended to be limiting, suitable phosphor for use in the blend with the present invention phosphors include:

$(Ba,Sr,Ca)_5(PO_4)_3(Cl,F,Br,OH):Eu^{2+}, Mn^{2+}, Sb^{3+}$
$(Ba,Sr,Ca)BPO_5:Eu^{2+}, Mn^{2+}$
$(Sr,Ca)_{10}(PO_4)_6*nB_2O_3:Eu^{2+}$
$2SrO*0.84P_2O_5*0.16B_2O_3:Eu^{2+}$
$(Mg,Ca,Sr,Ba,Zn)_3B_2O_6: Eu^{2+}$
$Sr_2Si_3O_8*2SrCl_2:Eu^{2+}$
$Ba_3MgSi_2O_8:Eu^{2+}$
$Sr_4Al_{14}O_{25}:Eu^{2+}$
$BaAl_8O_{13}:Eu^{2+}$
$(Ba,Sr,Ca)MgAl_{10}O_{17}:Eu^{2+},Mn^{2+}$
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2: Eu^{2+}, Mn^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Al,Ga)_5O_{12}:Ce^{3+}$
$(Ca,Sr)_8(Mg,Zn)(SiO_4)_4Cl_2:Eu^{2+}, Mn^{2+}$
$Na_2Gd_2B_2O_7:Ce^{3+},Tb^{3+}$
$(Ba,Sr)_2(Ca,Mg,Zn)B_2O_6:K,Ce,Tb$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+}, Bi^{3+}$
$(Ca,Sr)S:Eu^{2+}$
$SrY_2S_4:Eu^{2+}$
$CaLa_2S_4:Ce^{3+}$
$(Y,Lu)_2WO_6:Eu^{3+},Mo^{6+}$
$(Mg,Ca,Sr,Ba,Zn)_v(Si,Ge)_yN_{(2v/3+4y/3)}:Eu^{2+}$
$(Mg,Ca,Sr,Ba,Zn)_v(Si,Ge)_yO_zN_{(2v/3+4y/3+2z/3)}:Eu^{2+}$

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

Figure 8:
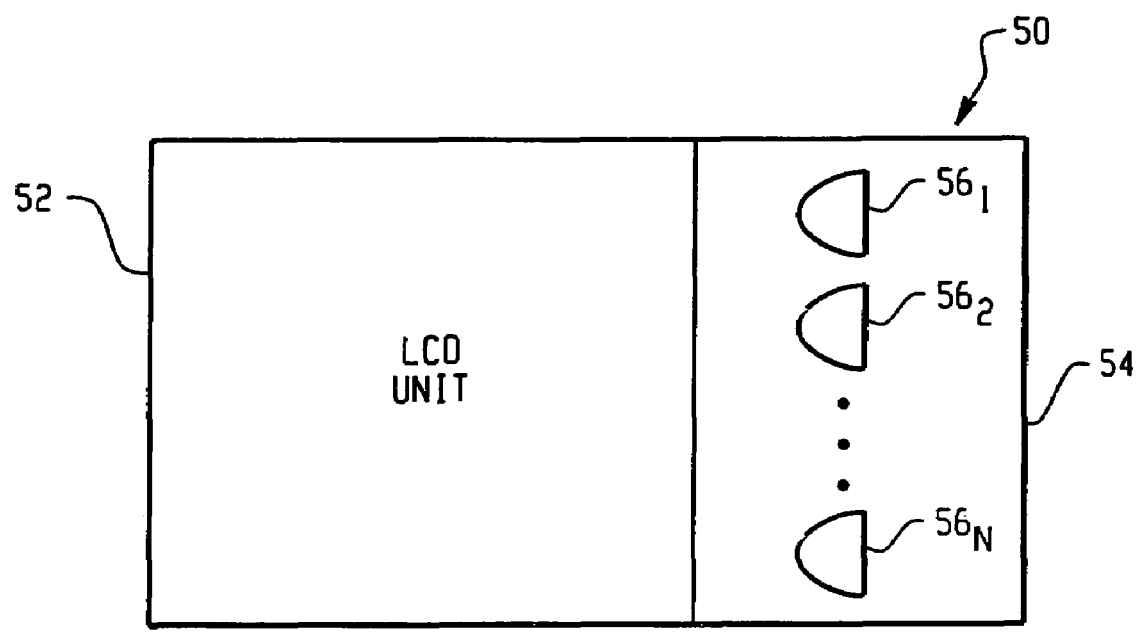
FIG. 8 is a perspective view of an LCD backlight according to one embodiment of the invention.

For example, in another embodiment, the $M_mO_nX$ or other of the above described phosphors can be used to generate red photons in an LCD backlight phosphor blend. FIG. 8 shows a system 50 for back-lighting a LCD unit via a mixture of saturated LEDs. FIG. 8 shows a side-elevational view of an LCD unit 52 including a back-lighting unit 54 having a number, N, of saturated LEDs $56_1$-$56_N$ suitably mounted to emit radiation toward a back panel of LCD unit 52. In system 50, the LEDs LEDs $56_1$-$56_N$ may, for example, be chosen to be two groups of LEDs each emitting different saturated colors. The $M_mO_nX$ phosphor may be used to emit the red color for the backlight. The two colors are typically chosen so that they lie on a line on the CIE chromaticity diagram that contains therebetween the coordinates of the target color.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a semiconductor light source; and
   a phosphor composition radiationally coupled to the light source, the phosphor composition comprising a phosphor composition including at least one of:
   (A) $A_{2-x}Eu_xW_{1-y}Mo_yO_6$, where A is selected from Y, Gd, Lu, La, and combinations thereof; and where $0.5 \leq x \leq 1.0$, $0.01 \leq y \leq 1.0$;
   (B) $M_mO_nX$, wherein M is selected from the group consisting of Sc, Y, La, a lanthanide, an alkali earth metal and mixtures thereof; X is a halogen; $1 \leq m \leq 3$; and $1 \leq n \leq 4$, and having a lanthanide doping level can range from 0.001% to 40% by weight; or
   (C) an $Eu^{3+}$ activated a phosphate or borate phosphor selected from the group consisting of (Y,Gd,Lu,La)PO$_4$; (Y,Gd,Lu,La)P$_3$O$_9$; (Y,Gd,Lu,La)P$_5$O$_{14}$; (Sr,Ba,Ca)$_3$(Lu,Gd,Y,La)P$_3$O$_{12}$; Ca$_{1.5}$Ba$_{1.5}$(La,Y,Gd,Lu)P$_3$O$_{12}$; (Y,La,Lu,Gd)BO$_3$; (Gd,Y,Lu,La)B$_3$O$_6$; (La,Gd,Lu,Y)(Al,Ga)$_3$B$_{4O12}$; (Y,Gd,Lu,La)MgB$_5$O$_{10}$; (Sr,Ca,Ba)(Lu,Gd,Y,La)B$_7$O$_{13}$; Ca$_{0.5}$Ba$_{0.5}$LaB$_7$O$_{13}$; and blends thereof.

2. The lighting apparatus of claim 1, wherein the light source is a semiconductor light emitting diode (LED) emitting radiation having a wavelength in the range of from about 370 to about 405 nm.

3. The lighting apparatus of claim 2, wherein the LED comprises a nitride compound semiconductor represented by the formula In$_i$Ga$_j$Al$_k$N, where $0 \leq i$; $0 \leq j$; $0 \leq K$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 1, wherein the phosphor composition is dispersed in an encapsulant.

8. The lighting apparatus of claim 1, further comprising a reflector cup.

9. The lighting apparatus of claim 1, wherein said phosphor composition further comprises one or more additional phosphor.

10. The lighting apparatus of claim 9, wherein said one or more additional phosphors are selected from the group consisting of (Ba,Sr,Ca)$_5$(PO$_4$)$_3$(Cl,F,Br,OH):Eu$^{2+}$,Mn$^{2+}$,Sb$^{3+}$; (Ba,Sr,Ca)BPO$_5$:Eu$^{2+}$,Mn$^{2+}$; (Sr,Ca)$_{10}$(PO$_4$)$_6$*nB$_2$O$_3$:Eu$^{2+}$; 2SrO*0.84P$_2$O$_5$*0.16B$_2$O$_3$:Eu$^{2+}$; (Mg,Ca,Sr,Ba,Zn)$_3$B$_2$O$_6$:Eu$^{2+}$; Sr$_2$Si$_3$O$_8$*2SrCl$_2$:Eu$^{2+}$; Ba$_3$MgSi$_2$O$_8$: Eu$^{2+}$; Sr$_4$Al$_{14}$O$_{25}$:Eu$^{2+}$; BaAl$_8$O$_{13}$:Eu$^{2+}$; (Ba,Sr,Ca)MgAl$_{10}$O$_{17}$:Eu$^{2+}$,Mn$^{2+}$; (Ba,Sr,Ca)Al$_2$O$_4$:Eu$^{2+}$; (Y,Gd,Lu,Sc,La)BO$_3$:Ce$^{3+}$,Tb$^{3+}$; Ca$_8$Mg(SiO$_4$)$_4$Cl$_2$:Eu$^{2+}$,Mn$^{2+}$; (Ba,Sr,Ca)$_2$SiO$_4$:Eu$^{2+}$; (Ba,Sr,Ca)$_2$(Mg,Zn)Si$_2$O$_7$: Eu$^{2+}$; (Sr,Ca,Ba)(Al,Ga,In)$_2$S$_{4:Eu}{}^{2+}$; (Y,Gd,Tb,La,Sm,Pr,Lu)$^3$(Al,Ga)$_5$O$_{12}$:Ce$^{3+}$; (Ca,Sr)$_8$(Mg,Zn)(SiO$_4$)$_4$Cl$_{2:Eu}{}^{2+}$, Mn$^{2+}$; Na$_2$Gd$_2$B$_2$O$_7$:Ce$^{3+}$,Tb$^{3+}$;(Ba,Sr)$_2$(Ca,Mg,Zn)B$_2$O$_6$: K,Ce,Tb;(Gd,Y,Lu,La)$_2$O$_3$: Eu$^{3+}$,Bi$^{3+}$; (Gd,Y,Lu.La)$_2$O$_2$S:Eu$^{3+}$,Bi$^{3+}$; (Gd,Y,Lu.La)VO$_4$:Eu$^{3+}$,Bi$^{3+}$; (Ca,Sr)S:Eu$^{2+}$; SrY$_2$S$_4$:Eu$^{2+}$; CaLa$_2$S$_4$:Ce$^{3+}$; (Y,Lu)$_2$WO$_6$:Eu$^{3+}$,Mo$^{6+}$; (Mg,Ca,Sr,Ba,Zn)$_v$(Si,Ge)$_y$N$_{(2v/3+4y/3)}$:Eu$^{2+}$; and (Mg,Ca,Sr,Ba,Zn)$_v$(Si,Ge)$_y$O$_Z$N$_{(2v/3+4y/3+2z/3)}$:Eu$^{2+}$.

11. An LCD backlight including a phosphor selected from the group consisting of (Y,Gd,Lu,La)PO$_4$:Eu; (Y,Gd,Lu,La)P$_3$O$_9$:Eu; (Y,Gd,Lu,La)P$_5$O$_{14}$:Eu; (Sr,Ba,Ca)3(Lu,Gd,Y,La)P$_3$O$_{12}$:Eu; Ca$_{1.5}$Ba$_{1.5}$(La,y,Gd,Lu)P$_{3O12}$:Eu; (Y,La,Lu,Gd)BO$_3$:Eu; (Gd,Y,LuLa)B$_3$O$_6$:Eu; (La,Gd,Lu,Y)(Al,Ga)$_3$B$_4$O$_{12}$:Eu; (Y,Gd,Lu,La)MgB$_5$O$_{10}$:Eu; (Sr,Ca,Ba)(Lu,Gd,Y,La)B$_7$O$_{13}$:Eu; Ca$_{0.5}$Ba$_{0.5}$LaB$_7$O$_{13}$:Eu; $M_mO_nX$, wherein M is selected from the group consisting of Sc, Y, a lanthanide, an alkali earth metal and mixtures thereof; X is a halogen; $1 \leq m \leq 3$; and $1 \leq n \leq 4$, and wherein the lanthanide doping level can range from 0.001 to 40% by weight; and $A_{2-x}Eu_xW_{1-y}Mo_yO_6$, where A is selected from Y,Gd,Lu,La, and combinations thereof; and where $0.5 \leq x \leq 1.0$, $0.01 \leq y \leq 1.0$; and blends thereof.

12. The LCD backlight according to claim 11, wherein said phosphor comprises at least one of La$_{0.95}$Eu$_{0.05}$PO$_4$; Gd$_{0.8}$Eu$_{0.2}$PO$_4$; Gd$_{0.8}$Eu$_{0.2}$P$_3$O$_9$; Gd$_{0.8}$Eu$_{0.2}$P$_5$O$_{14}$; Ca$_3$(PO$_4$)$_2$Gd$_{0.8}$Eu$_{0.2}$PO$_4$; Sr$_3$(PO$_4$)$_2$Gd$_{0.8}$Eu$_{0.2}$PO$_4$; Ca$_{1.5}$Ba$_{1.5}$(PO$_4$)$_2$Gd$_{0.8}$Eu$_{0.2}$PO$_4$; Ba$_3$(PO$_4$)$_2$Gd$_{0.8}$Eu$_{0.2}$PO$_4$; Ca$_3$(PO$_4$)$_2$ Y$_{0.95}$Eu$_{0.05}$PO$_4$; La$_{0.95}$Eu$_{0.05}$BO$_3$; Gd$_{0.8}$Eu$_{0.2}$BO$_3$; Y$_{0.95}$Eu$^{0.05}$Al$_3$B$_4$O$_{12}$; Gd$_{0.95}$Eu$_{0.05}$Al$_3$B$_4$O$_{12}$; Gd$_{0.8}$Eu$_{0.2}$Al$_3$B$_4$O$_{12}$; CaGd$_{0.8}$Eu$_{0.2}$B$_7$O$_{13}$; Ca$_{0.5}$Ba$_{0.5}$La$_{0.95}$Eu$_{0.05}$B$_7$O$_{13}$; Ca$_{0.5}$Ba$_{0.5}$Gd$_{0.8}$Eu$_{0.2}$B$_7$O$_{13}$; BaGd$_{0.8}$Eu$_{0.2}$B$_7$O$_{13}$; and combinations thereof.

13. A lighting apparatus for emitting white light comprising:
    a semiconductor light source; and
    a phosphor composition radiationally coupled to the light source, the phosphor composition comprising a phosphor composition including at least one of:
    (A) $A_{2-x}Eu_xW_{1-y}Mo_yO_6$, where A is selected from Y, Gd, Lu, La, and combinations thereof; and where $0.5 \leq x \leq 1.0$, $0.01 \leq y \leq 1.0$; and
    (B) $M_mO_nX$, wherein M is selected from the group consisting of Sc, Y, La, a lanthanide, an alkali earth metal and mixtures thereof; X is a halogen; $1 \leq m \leq 3$; and $1 \leq n \leq 4$, and having a lanthanide doping level can range from 0.001% to 40% by weight.

14. The lighting apparatus of claim 13, wherein said phosphor composition comprises Y$_{1.85}$Eu$_{0.15}$W$_{0.98}$Mo$_{0.02}$O$_6$.

15. The lighting apparatus of claim 13, wherein said phosphor composition comprises (La$_{0.985}$Sm$_{0.01}$Ce$_{0.005}$)OBr.

* * * * *